(12) United States Patent
Bryant et al.

(10) Patent No.: US 6,249,028 B1
(45) Date of Patent: Jun. 19, 2001

(54) OPERABLE FLOATING GATE CONTACT FOR SOI WITH HIGH VT WELL

(75) Inventors: Andres Bryant; Edward J. Nowak; Minh H. Tong, all of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/175,308

(22) Filed: Oct. 20, 1998

(51) Int. Cl.$^7$ .................................................... H01L 29/00
(52) U.S. Cl. .................. 257/350; 257/374; 257/375; 257/376; 257/347; 257/551; 257/491; 257/501; 257/348; 257/349; 257/350; 257/351; 257/352
(58) Field of Search ..................................... 257/347–352; 327/374–376; 250/551; 307/491–501

(56) References Cited

U.S. PATENT DOCUMENTS

| | | |
|---|---|---|
| 3,555,374 | 1/1971 | Koji Usuda . |
| 4,472,648 * | 9/1984 | Prentice ................................. 307/501 |
| 4,873,202 * | 10/1989 | Akiyama ................................. 438/63 |
| 4,989,057 | 1/1991 | Lu . |
| 5,013,926 * | 5/1991 | Ayizawa ................................. 250/551 |
| 5,567,968 | 10/1996 | Tsuruta et al. . |
| 5,629,544 | 5/1997 | Voldman et al. . |
| 5,683,918 | 11/1997 | Smith et al. . |
| 5,744,994 * | 4/1998 | Williams ................................. 327/374 |

FOREIGN PATENT DOCUMENTS

| | | |
|---|---|---|
| 59-163869 | 9/1984 | (JP) . |
| 9-115999 | 5/1997 | (JP) . |
| WO97/02602 | 1/1997 | (WO) . |

OTHER PUBLICATIONS

"Electrostatic Discharge Immune Storage Plate Structure For One–Device Cells", *IBM Technical Disclosure Bulletin*, vol. 29, No. 4, Sep. 1986, pp. 1514–1515.

* cited by examiner

Primary Examiner—Fetsum Abraham
(74) Attorney, Agent, or Firm—Pollock, Vande Sande & Amernick; Eugene I. Shkurko

(57) ABSTRACT

An FET structure for utilization with a silicon-on-insulator semiconductor device structure. The structure includes a silicon-on-insulator substrate structure. Source and drain diffusion regions are provided on the silicon-on-insulator substrate. An FET body region is interconnected with the source and drain diffusion regions. A gate oxide region is arranged over at least a portion of the body region and the source and drain diffusion regions. A gate region is arranged over at least a portion of the gate oxide region. A diode is interconnected with and provides a conductive pathway between the gate region and the FET body region. The diode is electrically isolated from the FET source and drain regions and inversion channel by a high threshold FET region.

5 Claims, 14 Drawing Sheets

OPERABLE FLOATING GATE CONTACT FOR SOI WITH HIGH VT WELL

FIELD OF THE INVENTION

The present invention relates to the field of semiconductor devices. In particular, the present invention relates to semiconductor-on-insulator (SOI) devices. More particularly, present invention relates to a floating gate protect diode structure for SOI devices.

BACKGROUND OF THE INVENTION

Semiconductor-on-insulator (SOI) technology relates to high-speed MOS and CMOS circuits. According to SOI, a thin layer of semiconductor material is deposited on an insulator to reduce the capacitive coupling between the semiconductor layer and the underlying substrate material.

CMOS FET gates are subjected to charging that can degrade gate insulator quality. Typically, circuits on a semiconductor chip include at least one protective component. A common solution in bulk CMOS is to connect a diode between the FET gate and the FET body at the first wiring, or metal, level available. This is the floating-gate protect diode (FGPD). The FGPD is electrically isolated from the FET source and drain and require a small area, for example, a single contact, in bulk CMOS.

Charge accumulated in the FET gate during subsequent processing will discharge through the FGPD into the FET body and not through the FET insulator. Thus, damage to the insulator is avoided.

However, inherent to silicon-on-insulator (SOI) structures is the inability to form dense diodes between the FET gate and body that are electrically isolated from the FET source and drain.

SUMMARY OF THE INVENTION

The present invention provides solutions to these and other problems by presenting an FET structure for utilization with a silicon-on-insulator semiconductor device structure. The structure includes a silicon-on-insulator substrate structure. Source and drain diffusion regions are provided on the silicon-on-insulator substrate. An FET body region is interconnected with the source and drain diffusion regions. A gate oxide region is arranged over at least a portion of the body region and the source and drain diffusion regions. A gate region is arranged over at least a portion of the gate oxide region. A diode is interconnected with and provides a conductive pathway between the gate region and the FET body region. The diode is electrically isolated from the FET source and drain regions and inversion channel by a high threshold FET region.

Aspects of the present invention also provide methods for forming an FET structure including a diode on a silicon-on-insulator semiconductor structure.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1:
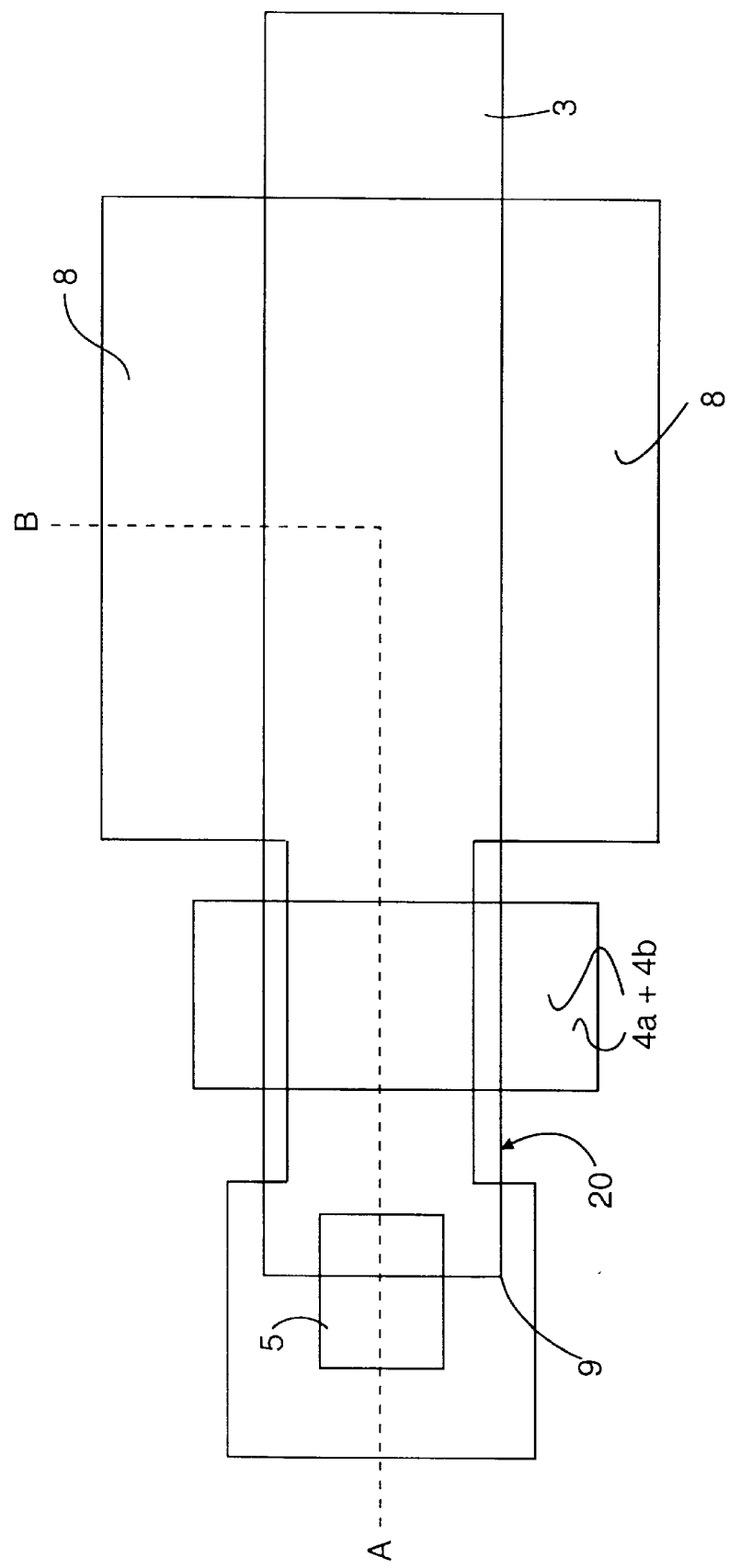
FIG. 1 represents a top view of an embodiment of an FET structure for utilization with a silicon-on-insulator semiconductor device structure according to the present invention.

During both manufacturing and operation, semiconductor devices are subject to charging and associated effects. For example, CMOS FET gates may be subject to charging during reactive ion etch processes used to form metal wiring. Such charging can degrade gate insulator reliability.

A common solution addressing electrostatic charging in bulk CMOS is to connect FET gates to diodes at first metal. Such diodes may be referred to as floating gate protect diodes. The protect diodes provide a path for the gates to discharge into the bulk, or body, of the chip during subsequent processing, thereby resulting in improved reliability.

In bulk CMOS, protect diodes may require a small area, such as a single contact. However, in SOI devices protect diodes between the gate and the body of the FETs that are electrically isolated from the FET source and drain may be difficult if not impossible to form. The present invention provides a structure and technique for forming a protect diode in an SOI device. In doing so, the present invention provides a structure to protect the device from excessive charging. This invention shows how dense silicon-on-insulator floating gate protect diodes (SOIFGPD) can be formed via a simple but unconventional layout technique.

According to the present invention, the RX layout of an SOI FET may be modified to enable the formation of an SOIFGPD that is contacted to the FET gate via a local interconnect or first wiring metal. The RX region of an SOI FET defines where the CMOS field isolation is not formed. The field isolation can be formed via standard CMOS fabrication techniques, such as by shallow trench isolation (STI) or local oxidation of silicon (LOCOS). The result of such a modification is an SOI floating gate protect diode (SOIFGPD) that does not add significantly to the area of the device, particularly relative to bulk protect diodes. The results is an SOIFGPD that is dense and has a minor impact on gate capacitance.

As stated above the present invention provides a floating gate protect diode structure for SOI devices. As such, the present invention provides a structure to protect the gate oxide of a silicon on insulator MOSFET. In doing so, the present invention provides a conductive path from the gate of an SOI MOSFET to the body. The structure of the present invention thus protects the gate from charging, particularly charging during manufacturing processes. The conductive path provided by the present invention is a blocking diode that blocks conduction to the body of the SOI MOSFET during normal MOSFET switching operation.

In general, a structure according to the present invention is useful with SOI FET devices. Accordingly, the present invention includes a substrate having a dielectric layer therein. A plurality of FETs are formed within the substrate above the dielectric layer. Each FET includes first diffusion regions of a first dopant type in the substrate. A gate region overlaps the diffusion regions. A plurality of contact regions are provided in the substrate of the first dopant type. Each contact region is associated with one of the FETs.

A structure according to the present invention also includes dielectric regions that extend into the substrate at least down to the dielectric layer for isolating the FETs and the contact regions of the FETs from each other.

A conductive pathway is provided between the gate region of each FET and the associated contact region. As described above, the conductive pathway is really the heart of the present invention. As such, the conductive pathway may include the protect diode for protecting the FETs from electrostatic discharges. The diode is electrically isolated from the FET source and drain regions as well as from the FET inversion channel. The isolation may be accomplished by a high threshold FET region.

Figure 2:
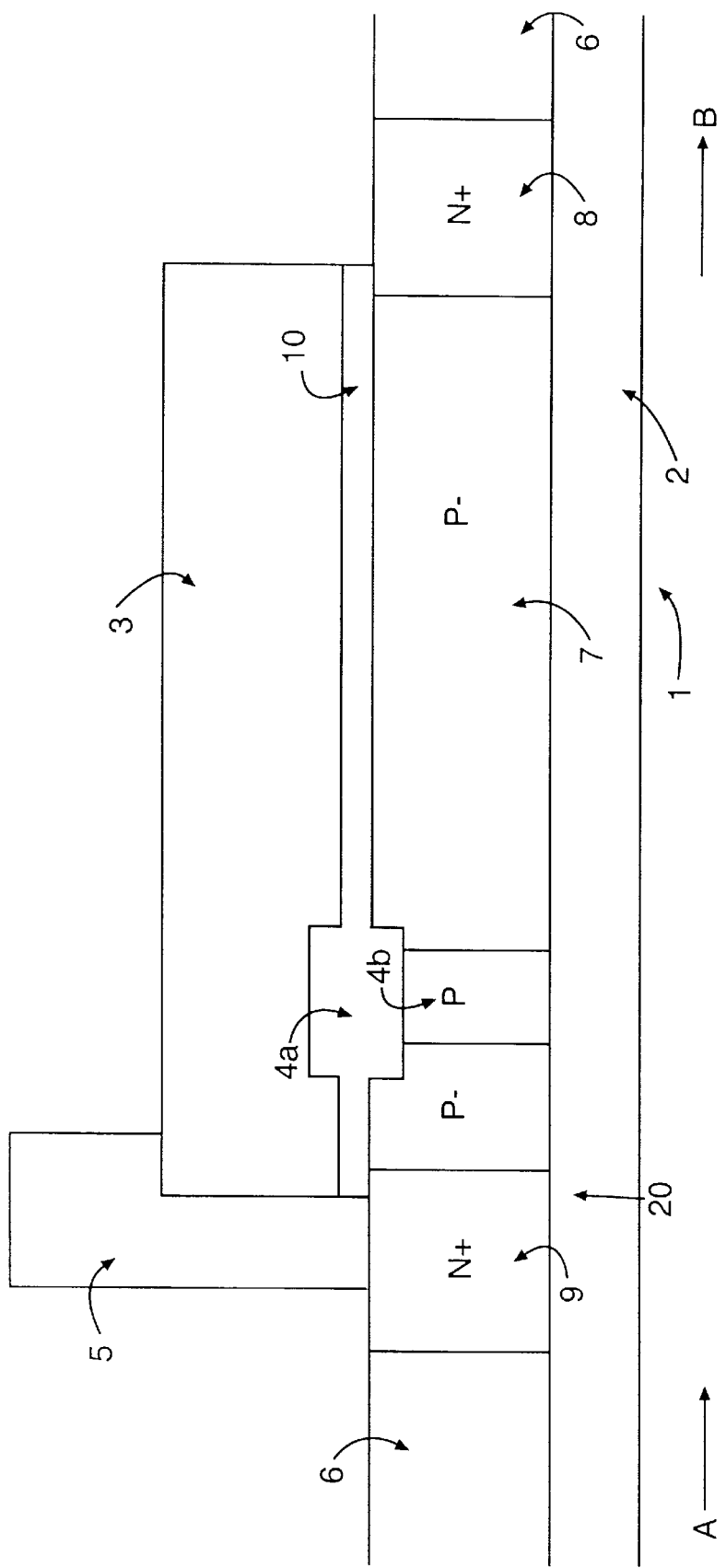
FIG. 2 represents a cross-sectional view of the embodiment of the present invention illustrated in FIG. 1 taken along the line A–B.

FIG. 1 provides an overhead view an embodiment of a structure according to the present invention. As can be seen in FIGS. 1 and 2, the present invention may include a RX extension or tab 20 extending beneath and beyond the FET gate region 3 overlapping the field isolation 6 along one side of the FET. The RX region that extends beyond the FET gate area 3 forms a diode 9 to the FET body 7 directly below the gate.

FIG. 2 illustrates the doping type of each region. FIGS. 1 and 2 also illustrate the source and drain regions 8 of the FET. The FET depicted in FIGS. 1 and 2 may be isolated from adjacent FETs by field isolation regions 6.

The embodiment of the present invention shown in FIGS. 1 and 2 is formed on a silicon-on-insulator substrate structure. The silicon-on-insulator substrate structure includes a silicon substrate 1 and an isolation region 2 of an electrically insulating material. Isolation region 2 may be made of an oxide.

The diode can be connected to the FET gate using a local interconnect 5 to form a dense SOIFGPD. The diode-gate connection can also be made with any standard CMOS contact wiring process.

The SOIFGPD typically is electrically isolated from the FET source/drain regions 8 even when a voltage is applied to the FET gate that induces a conducting source-drain inversion channel. Electrically isolating the SOIFGPD from the FET source/drain regions may be accomplished through locally increasing the FET threshold voltage in the RX tab extension beneath the FET gate. This region that exhibits the increased threshold voltage is identified as the thick-oxide 4a and high threshold voltage (high-Vt) well 4b regions in the embodiment illustrated in FIGS. 1 and 2. Either a masked high-Vt well implant and/or a dual gate-oxide process can be used to raise the threshold sufficiently in this region to isolate the SOIFGPD from the source/drain pockets.

As stated above, FIG. 2 illustrates a cross-sectional view of the embodiment of the SOIFGPD illustrated in FIG. 1 along the line A–B. The cross-section illustrated in FIG. 2 shows the SOIFGPD implementation for an NFET. The PFET implementation is simply derived by changing the N-type doped silicon regions to P-type and vice-versa.

The present invention may include a local interconnect 5 to connect the FET gate 3 to the SOIFGPD N+ diffusion 9. The high-Vt FET region formed by the thick oxide 4a and high-Vt P well 4b regions electrically isolate the SOIFGPD N+ diffusion from the inversion channel induced in the P-well region 7 and, thus, the N+ FET drain/source diffusions 8.

Figure 3:
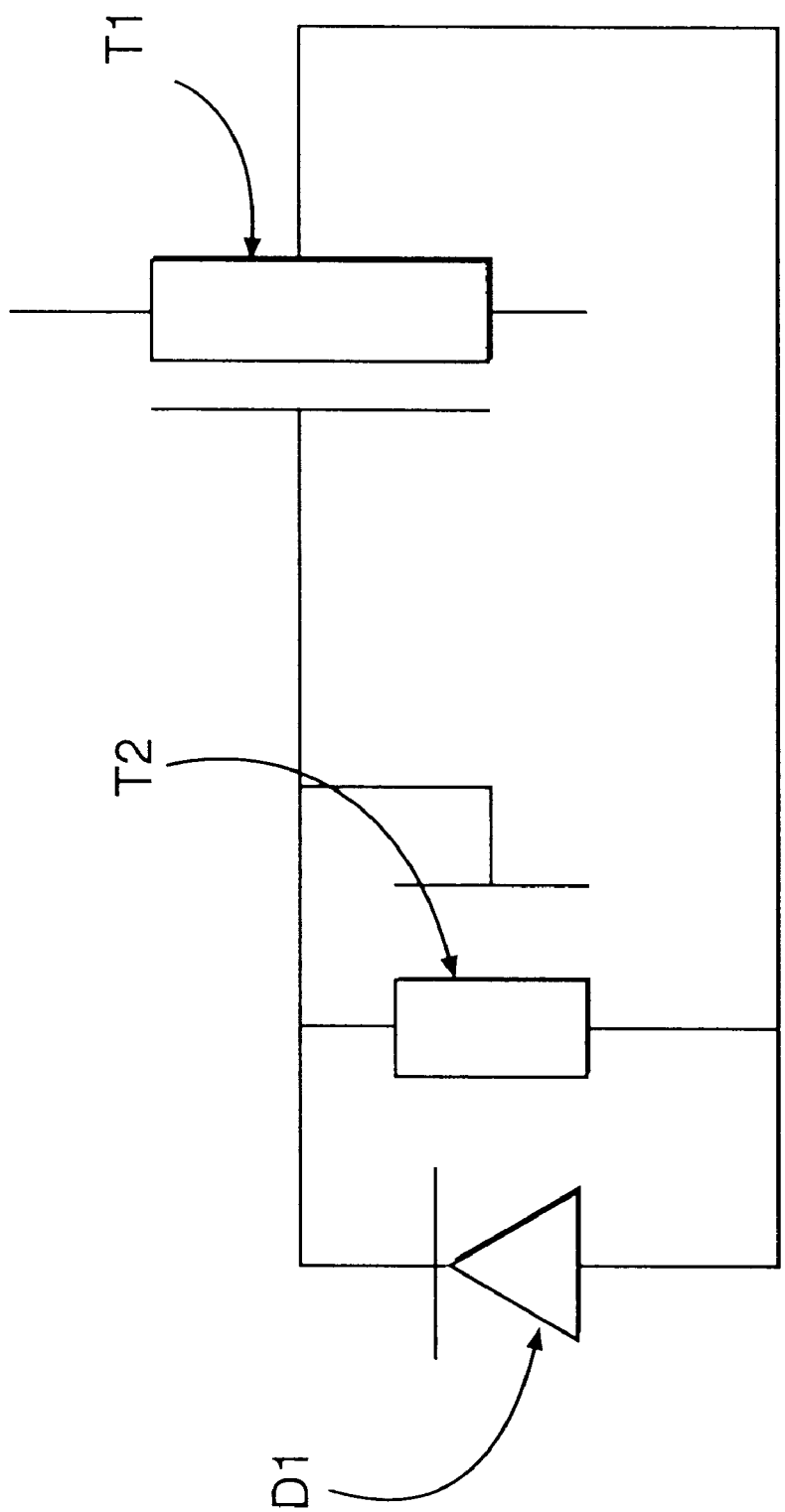
FIG. 3 represents a schematic diagram of an embodiment of an FET structure for utilization with a silicon-on-insulator semiconductor device structure according to the present invention.

FIG. 3 represents schematic illustration of an embodiment of a circuit that includes an SOIFGPD device according to the present invention. In FIG. 3, T1 represents a thin-oxide FET formed by the gate 3, the thin gate oxide 10, the P-well region or body of the FET 7, and the source/drain diffusions 8. Also, in FIG. 3, D1 represents the FGPD diode formed by the N+ diffusion 9 within the RX tab. T2 represents the parasitic high threshold voltage FET formed by the FET gate 3, the thick gate oxide 4a, and the high threshold voltage P well 4b. The FGPD N+ diffusion 9 may be one source/drain of the T2, while the FET T1 inversion channel induced in the P-well 7 may be the other source/drain of T2.

Charge accumulated in the FET gate 3 during subsequent processing may discharge through the FGPD D1 into the FET body 7 and not through the FET insulator 10. Thus, damage to the gate insulator may be avoided. The threshold voltage of T2 may be set sufficiently high via thick gate oxide 4a and high doping in the high voltage well P region 4b to electrically isolate the D1 N+ diffusion 9 from the T1 inversion channel induced in the p-well 7 and consequently the source/drain diffusions during use.

The present invention also provides methods for forming operable floating gate structures for an SOI device such as that described above. The methods include forming the above-described structures. Commonly known techniques, including photolithographic, etching, doping, and implant, among others, may be utilized to form the structure of the present invention.

According to one example, the present invention provides a process for forming an FET structure on a silicon-on-insulator semiconductor structure. According to the process, a silicon-on-insulator substrate is provided. Source and drain diffusion regions are provided on the silicon-on-insulator substrate. A body region is provided interconnected with the source and drain diffusion regions. A gate oxide region is provided arranged over at least a portion of the body region and the source and drain diffusion regions. A gate region is provided arranged over at least a portion of the gate oxide region. A diode is provided interconnected with and providing a conductive pathway between the gate region and the body region.

Figure 4A:
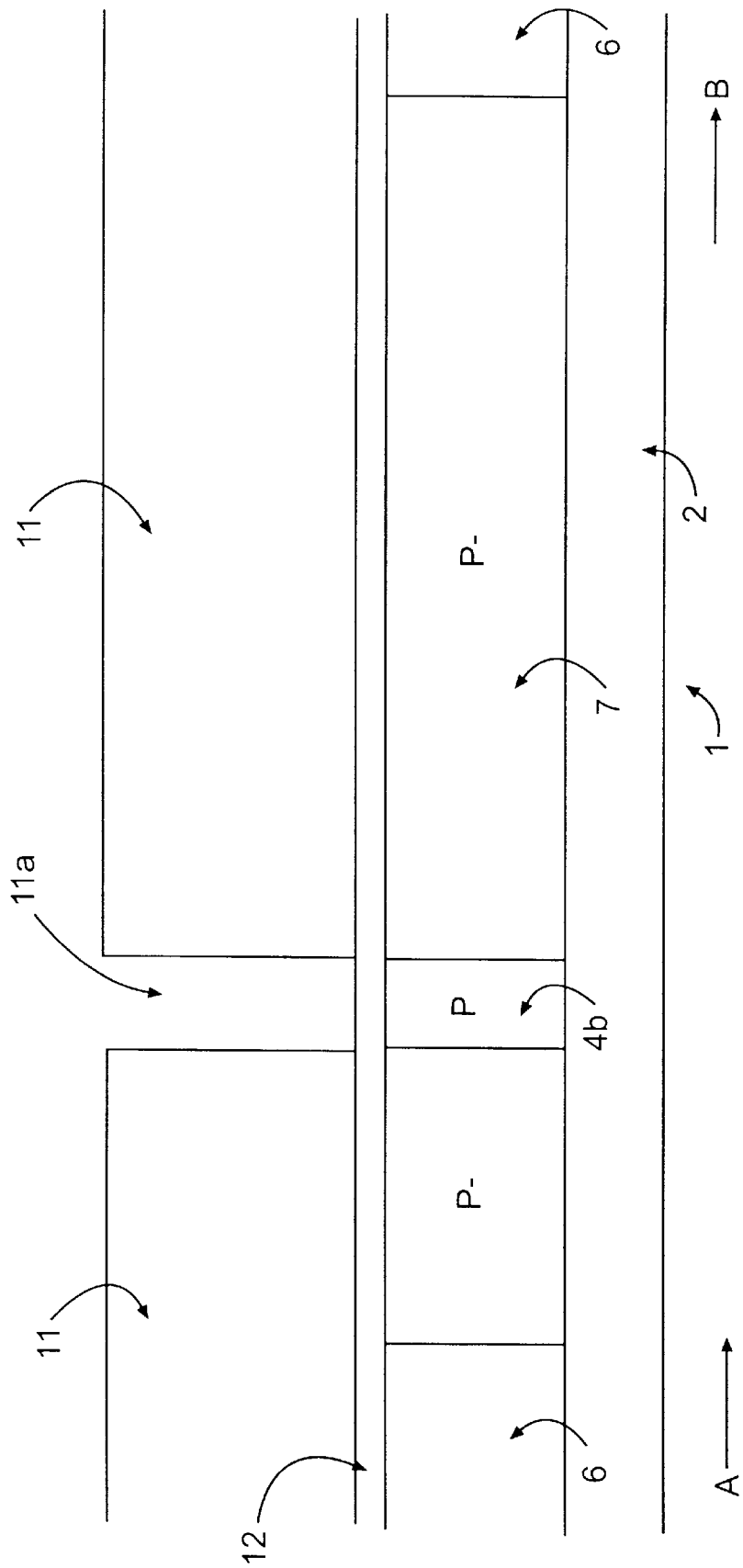
FIGS. 4a–e represent cross-sectional views of a structure during various stages of an embodiment of a method according to the present invention for forming an embodiment of an FET structure for utilization with a silicon-on-insulator semiconductor device structure according to the present invention taken along the line A–B in FIG. 1.
Figure 4B:
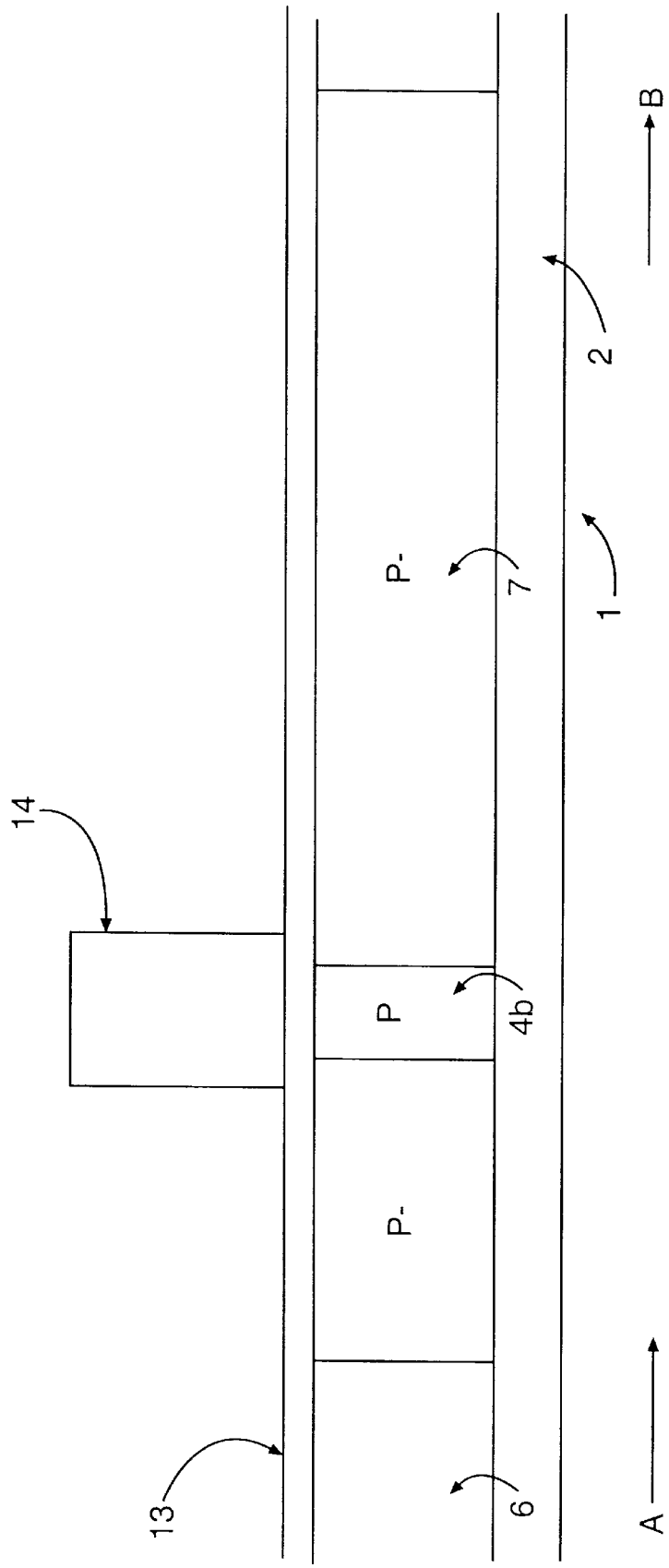

According to one specific example, various stages of which are illustrated in FIGS. 4a–4e, a SOIFGPD according to the present invention is fabricated with standard CMOS fabrication techniques. FIGS. 4a–4b represent cross-sectional views taken along a line similar to line A–B in FIG. 1. According to the method, field oxide regions 6 are first formed on a silicon-on-insulator wafer substrate. The field oxide region may be more broadly described as a first layer of an electrically insulating material. As can be appreciated from the above description of the structure according to the present invention, various regions of the structure will be formed in the field oxide regions 6.

After formation of oxide layer 6, a second layer of an electrically insulating material may be deposited over the entire surface of the structure, including on layer 6. The second layer of electrically insulating material may be an oxide layer. Oxide layer 12 typically is described as a screen oxide.

After formation of screen oxide layer 12, various known ion implant operations may be carried out to create the desired structures with the characteristics illustrated in FIG. 4a. For example, FET body, or P-well, 7 may be formed at this time.

After deposition of screen oxide layer 12 and ion implant, a first layer of a photoresist 11 may be deposited on screen oxide layer. The photoresist may then be patterned according to standard techniques. As illustrated in FIG. 4a, an opening 11a may be formed in photoresist layer 11. The photoresist may then be used as a mask to block high-Vt P well implants and implant to form the high-Vt P well region 4b. The resulting structure is shown in FIG. 4a.

After ion implant to form the high-Vt well, the photoresist layer 11 and the screen oxide layer 12 may be removed. Another layer of an electrically insulating material 13 may then be provided on the layer that includes FET body 7, high-vt well 4b, among other features. The layer of electrically insulating material 13 may be a thermal oxide layer.

Figure 4C:
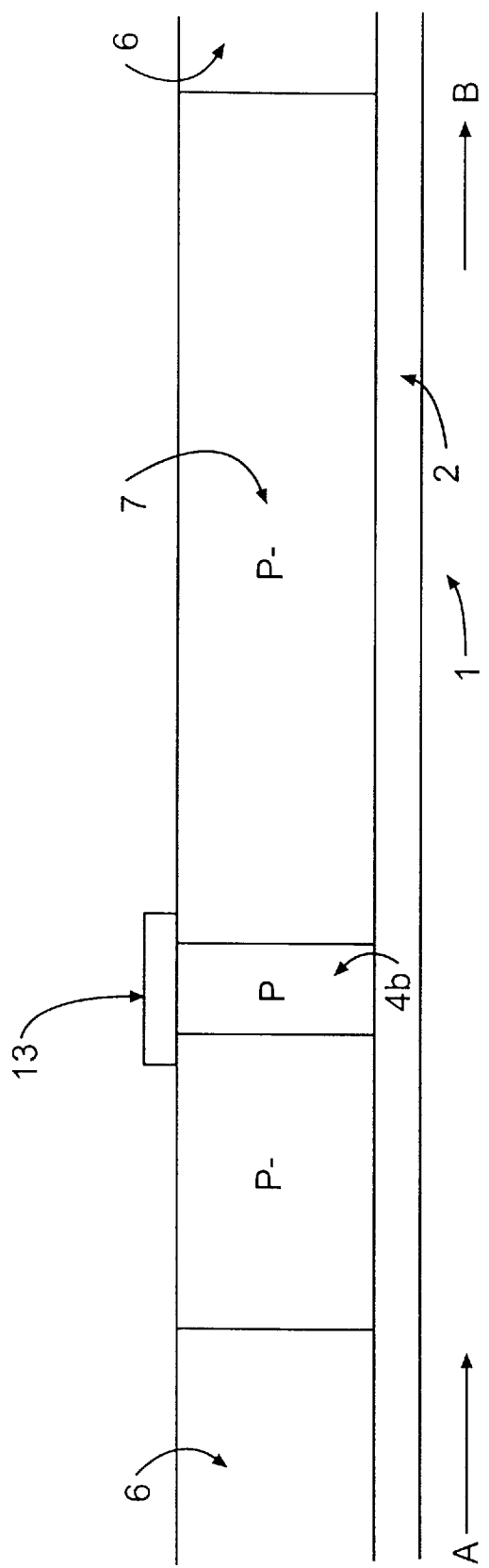
Figure 4D:
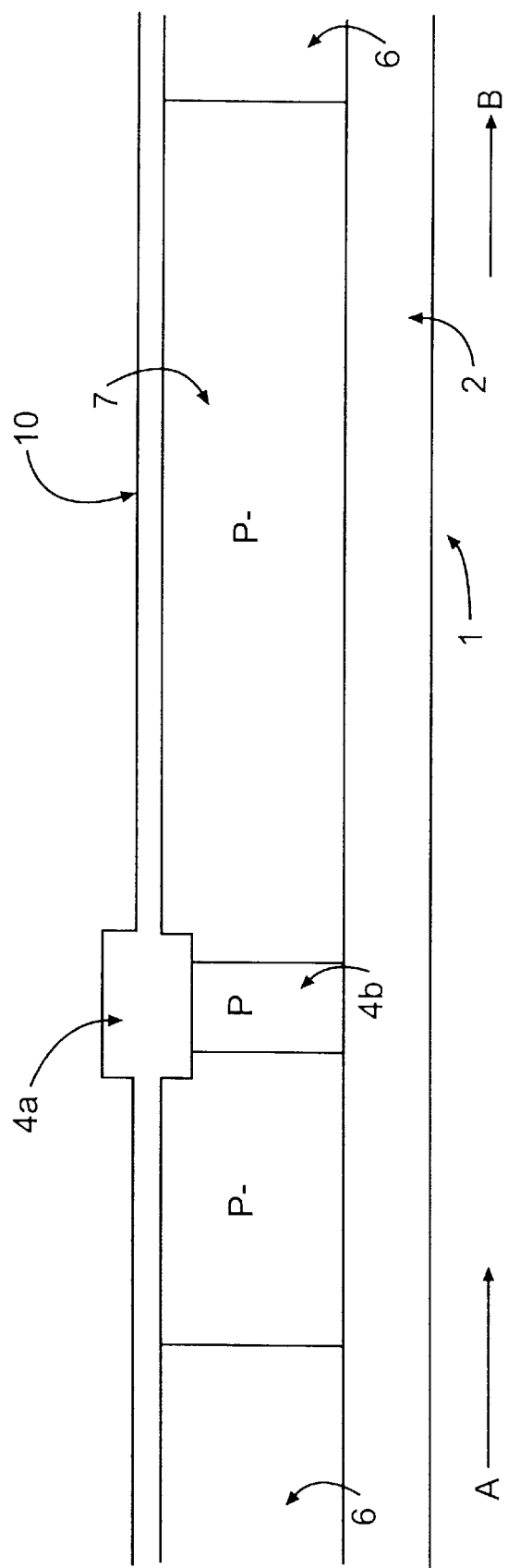

A second layer of photoresist 14 may then be provided on thermal oxide layer 13. The photoresist may then be patterned to result in the structure shown in FIG. 4b. The remaining portion of the photoresist layer 14 will act as a mask to prevent etching of oxide layer 13 over the high-Vt region 4b. After patterning the photoresist layer 14, the oxide layer 13 may be etched. After etching of the oxide layer, the remaining photoresist 14 may be removed. FIG. 4c illustrates the resulting structure, with remaining oxide portion 13.

A layer of an electrically insulating material 10 may then be formed on the entire structure, including layer 6, structures 7, 4b, and others. The layer of an electrically insulating material 10 may be a thermal oxide layer grown on the layer 6. The thicker region 4a results from oxide layer 10 being deposited on remnant of oxide layer 13 illustrated in FIG. 4c. Such is a known CMOS dual-oxide process (see U.S. Pat. No. 4,236,167, assigned to RCA corporation, issued in 1980, the entire contents of the disclsure of which is hereby incorporated by reference).

Gate conductor material 3 may then be deposited and patterned. The gate conductor material may be patterned utilizing standard CMOS fabrication techniques. Exposed regions of oxide layer 10 can then be removed with standard known CMOS fabrication techniques. The N+ diffusions 8 and 9, representing the source/drain regions and diode, respectively, may then be created, also utilizing standard, known CMOS fabrication techniques.

Figure 4E:
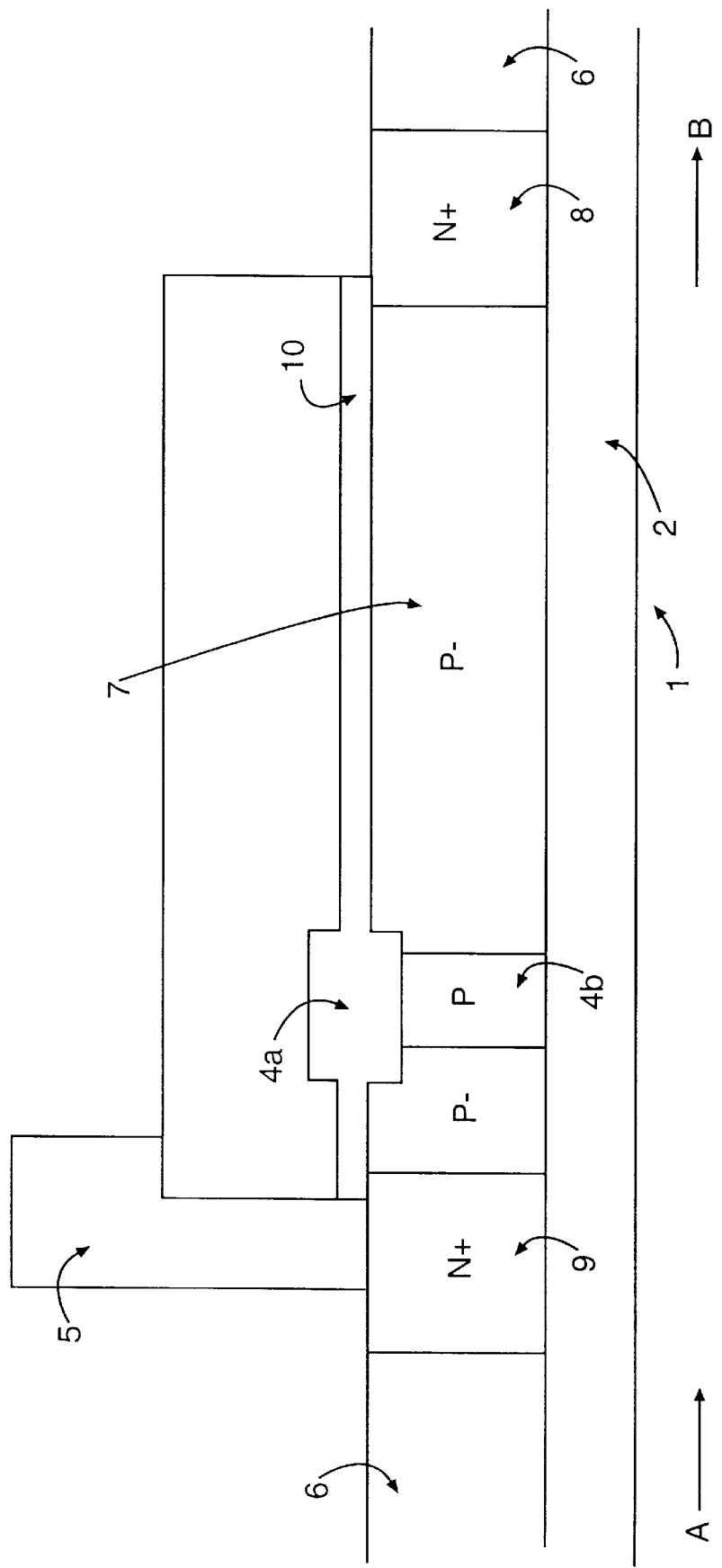
Figure 5:
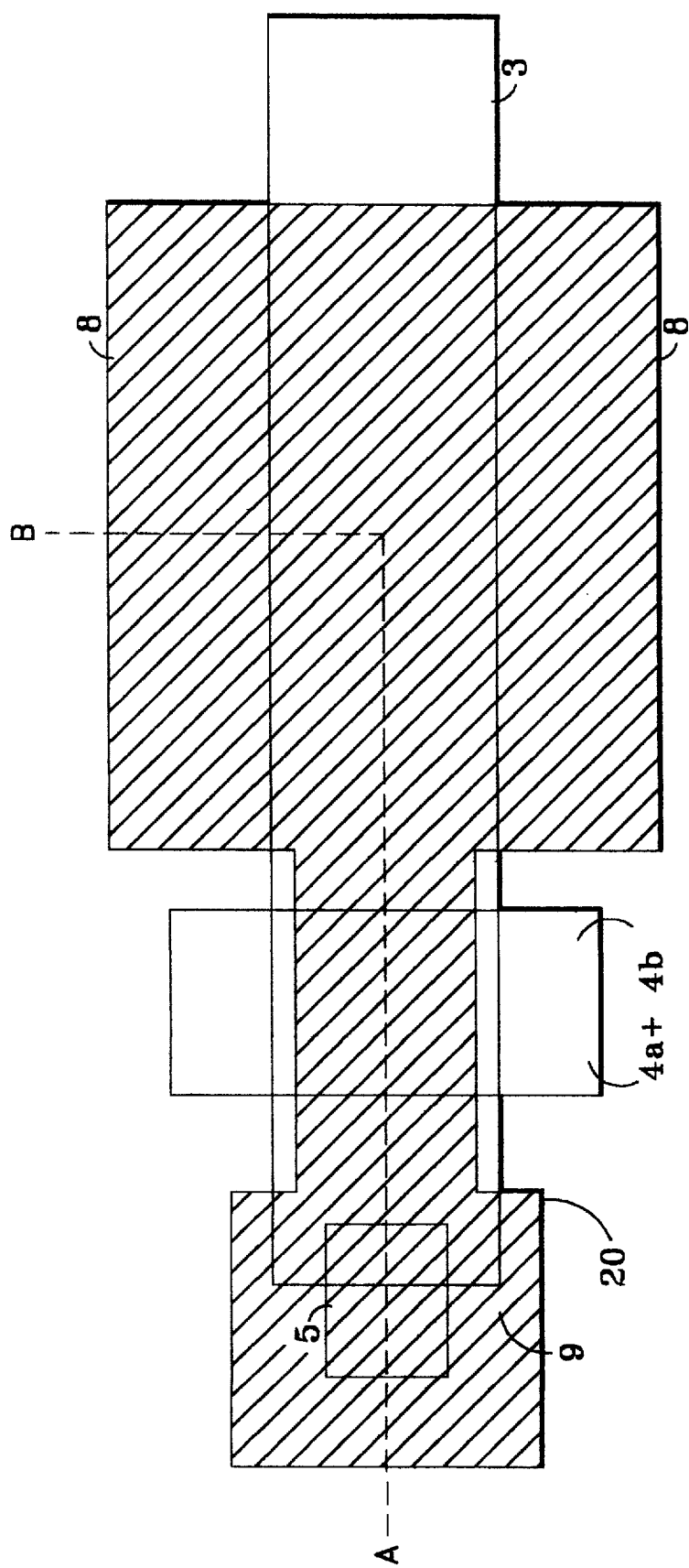
FIGS. 5–10 illustrate the RX, body, and high Vt regions of an embodiment of a structure according to the present invention.
Figure 6:
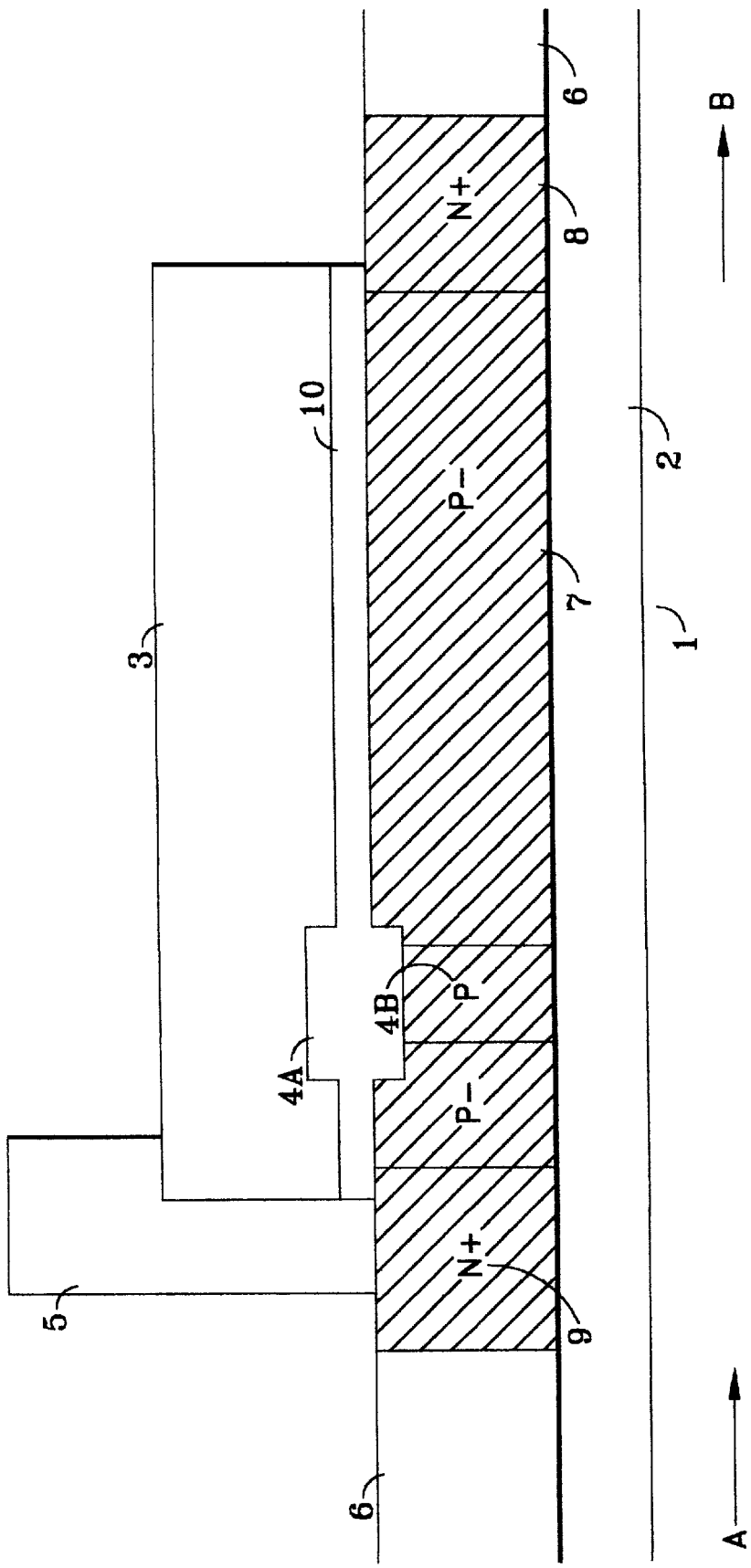
Figure 7:
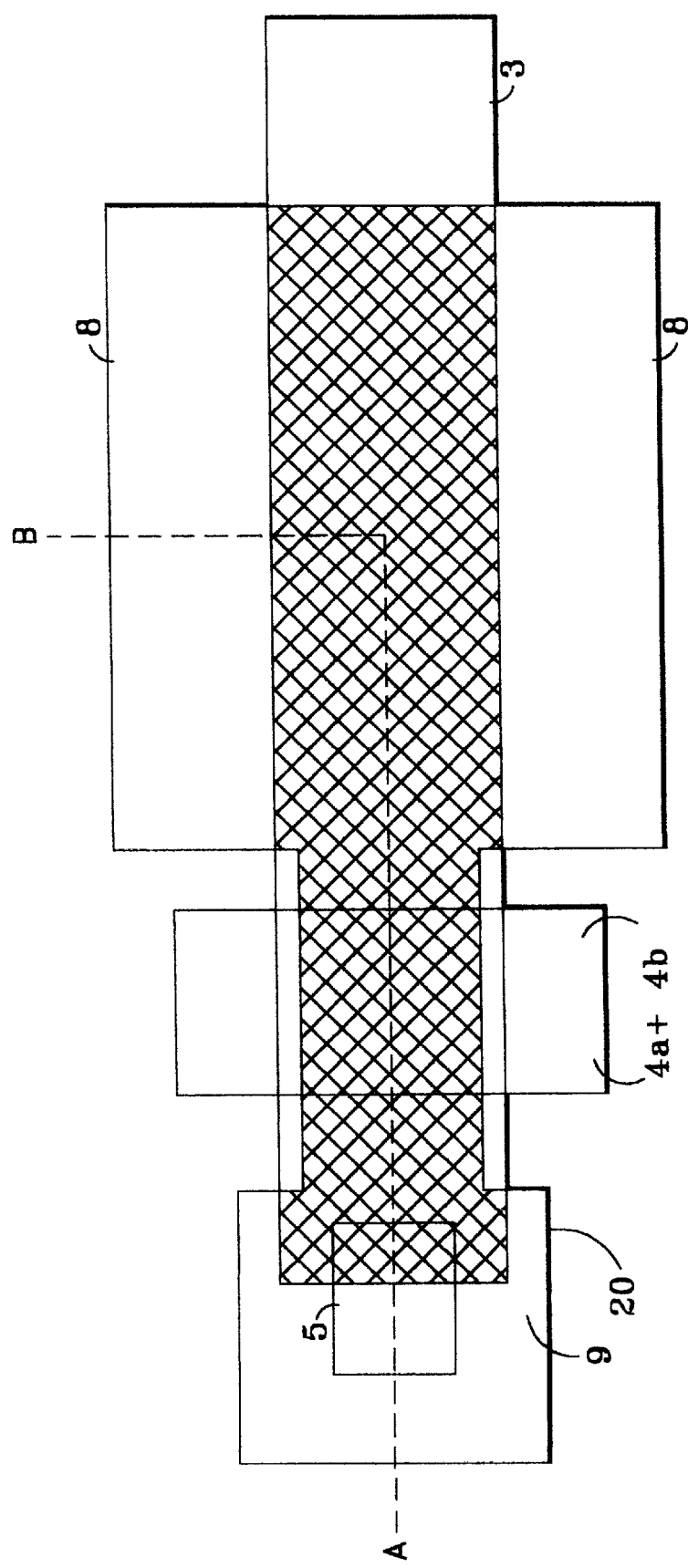
Figure 8:
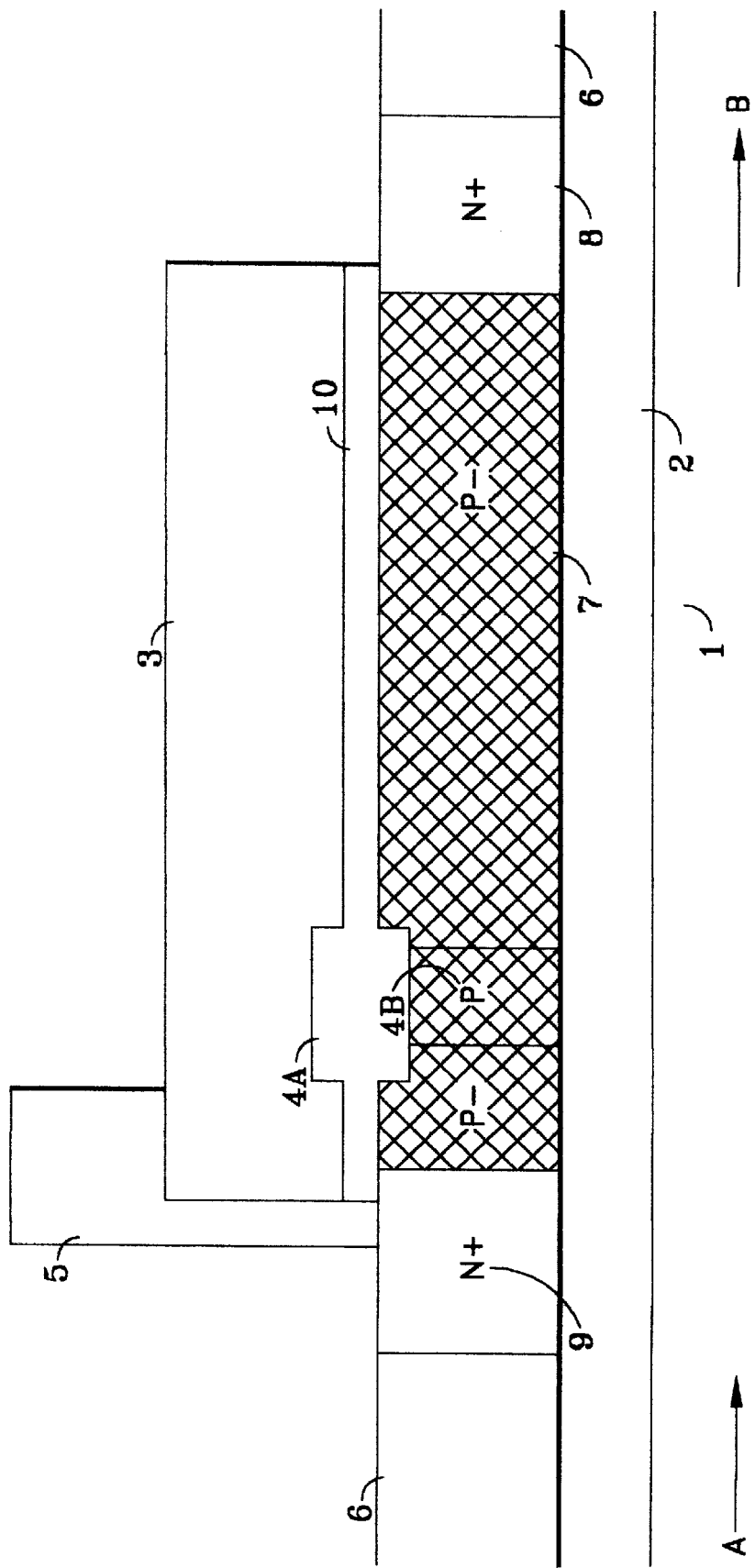
Figure 9:
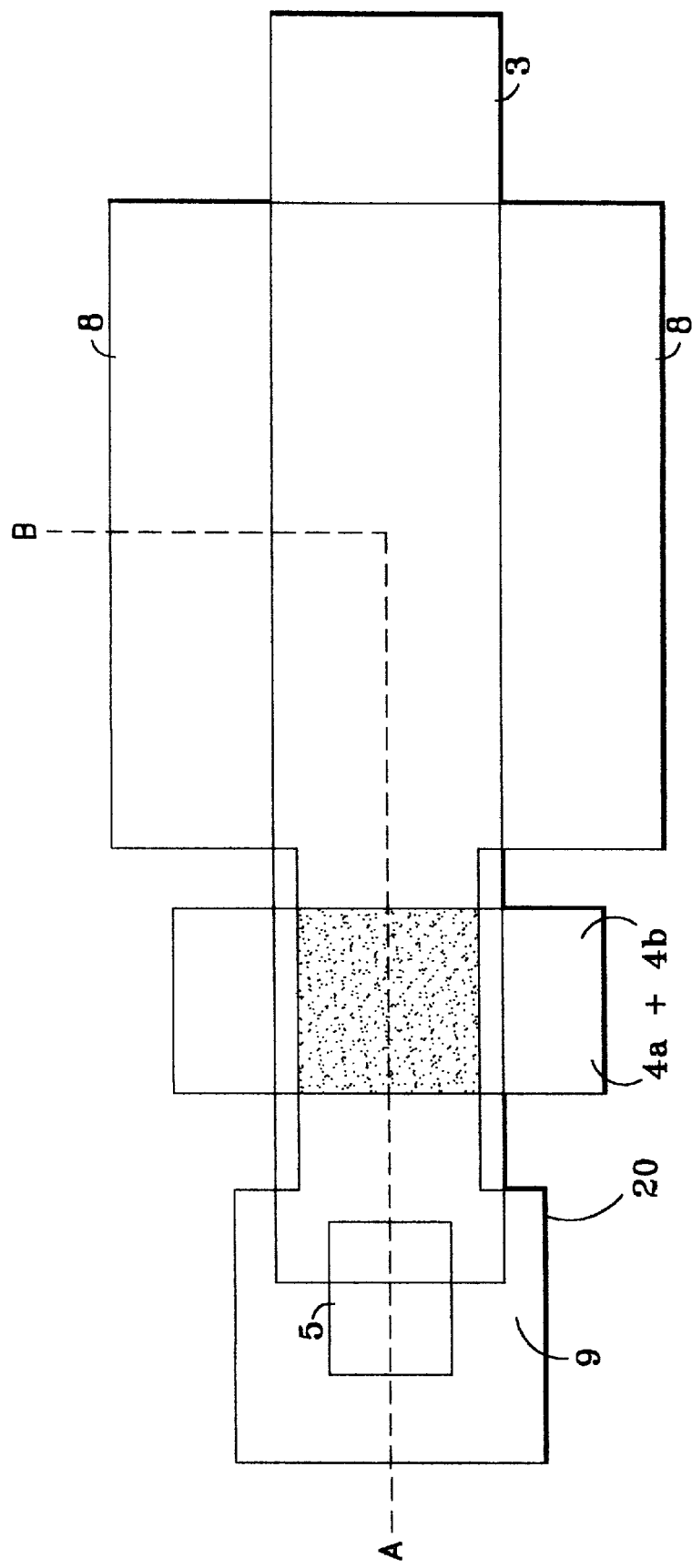
Figure 10:
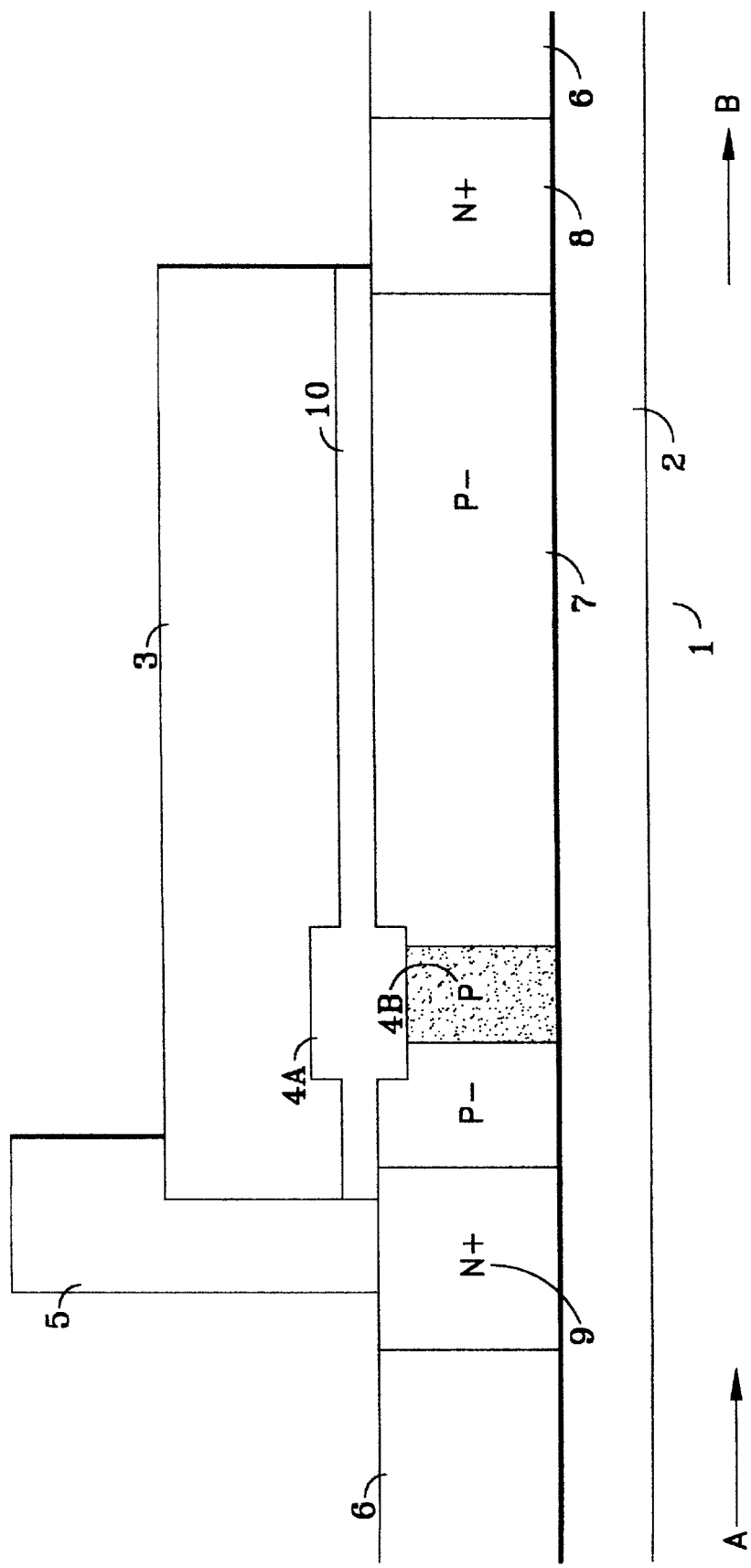

After formation of the diode (SOIFGPD), a local metal interconnect 5 may be formed to connect the gate 3 and the SOIFGPD N+ pocket 9. Once again, standard, known CMOS fabrication techniques may be utilized to form the local interconnect. FIG. 4e illustrates the resulting structure. From this point on, standard CMOS fabrication techniques can be used to from the subsequent wiring and interconnect levels.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. An FET structure for utilization with a silicon-on-insulator semiconductor device structure, comprising:

a silicon-on-insulator substrate structure;

source and drain diffusion regions on the silicon-on-insulator substrate;

a body region interconnected with the source and drain diffusion regions;

a gate oxide region arranged over at least a portion of the body region and the source and drain diffusion regions;

a gate region arranged over at least a portion of the gate oxide region; and a diode interconnected with and providing a conductive pathway between the gate region and the body region; wherein the diode is electrically isolated from the source and drain regions of the FET by locally increasing the threshold of the FET in the region of the diode that extends beyond the gate region of the FET by including between the source and drain regions of the FET and said diode a high Vt doped well sandwiched between regions having dopant densities lower than that of the high Vt doped well and by gate oxide of increased thickness at least in contact with the high Vt doped well; and wherein the diode comprises a region having the same conductivity type as the source and drain diffusion regions and one of the regions having dopant densities lower than that of the high Vt doped well and being of the opposite conductivity type as that of the source and drain diffusion regions.

2. The semiconductor device according to claim 1, further comprising:

a local interconnect for connecting the diode and the gate region of the FET.

3. The semiconductor device according to claim 1, wherein the diode includes a RX extension region provided below the gate region of the FET and extending beyond the gate region of the FET.

4. The semiconductor device according to claim 1, wherein the diode is connected to the gate of the FET at a first metal wiring level.

5. The semiconductor device according to claim 1, further comprising:

at least one masked Vt-adjust implant associated with the FET for raising the threshold of the FET.

* * * * *